(12) United States Patent
Shibutani

(10) Patent No.: US 6,787,823 B2
(45) Date of Patent: Sep. 7, 2004

(54) SEMICONDUCTOR DEVICE HAVING CELL-BASED BASIC ELEMENT AGGREGATE HAVING PROTRUDING PART IN ACTIVE REGION

(75) Inventor: Koji Shibutani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/315,102

(22) Filed: Dec. 10, 2002

(65) Prior Publication Data

US 2004/0014272 A1 Jan. 22, 2004

(30) Foreign Application Priority Data

Jul. 19, 2002 (JP) ........................................ 2002-211184

(51) Int. Cl.$^7$ ............................................. H01L 27/10
(52) U.S. Cl. ........................ 257/206; 257/204; 257/208
(58) Field of Search ................................ 257/204, 206, 257/208

(56) References Cited

U.S. PATENT DOCUMENTS 5,164,811 A * 11/1992 Tamura ...................... 257/206
5,187,556 A * 2/1993 Nariishi et al. ............. 257/206
5,598,347 A * 1/1997 Iwasaki .......................... 716/8
5,923,060 A * 7/1999 Gheewala ................... 257/207

FOREIGN PATENT DOCUMENTS

JP 2001-068653 3/2001

* cited by examiner

Primary Examiner—Jerome Jackson
(74) Attorney, Agent, or Firm—Oblon, Spivak, McClelland, Maier & Neustadt, P.C.

(57) ABSTRACT

A semiconductor intergrated circuit including p-type active regions and n-type active regions provided on a semiconductor substrate. Gate interconnect lines are arranged in a first predetermined direction on the p-type active regions and the n-type active regions. One of the p-type active regions and the n-type regions is provided with at least one protruding part for holding contact holes. A width along a second predetermined direction of the protruding part is larger than a width along the second direction of a space defined between two adjacent gate interconnect lines on the p-type active regions and the n-type active regions.

14 Claims, 11 Drawing Sheets

SEMICONDUCTOR DEVICE HAVING CELL-BASED BASIC ELEMENT AGGREGATE HAVING PROTRUDING PART IN ACTIVE REGION

BACKGROUND OF THE INVENTION

1. Field of the Invention

The present invention relates to the configuration of a basic element aggregate to be incorporated into a large-scale semiconductor integrated circuit. More particularly, it relates to a cell-based basic element aggregate.

2. Description of the Background Art

Semi-custom LSIs are roughly classified into the following groups: PLD (programmable logic device), FPGA (field programmable gate array), gate array, and cell based IC (also referred to as a standard cell).

According to the gate array, primitive cells for constituting a gate are systematically arranged in advance on a semiconductor substrate. These cells are interconnected according to a user's circuitry, to realize a desired LSI. FIG. 16 is a plan view illustrating gate array. In FIG. 16, gate interconnect lines 100 are shown to be equally spaced, namely, gate patterns (gate structures) are shown to be uniform according to the configuration of the gate array. An N-type impurity diffusion region, the gate interconnect line 100, and another n-type impurity diffusion region adjacent to this gate interconnect line 100 form a transistor. These n-type impurity diffusion regions adjacent to each other through the gate interconnect line 100 are referred to as n-type active regions 101. A plurality of p-type impurity diffusion regions arranged in the same manner as the plurality of n-type active regions 101 are referred to as p-type active regions 102. The gate interconnect line 100, the n-type active region 101, and the p-type active region 102 are provided with contact holes 103 for interconnecting a plurality of transistors including the gate interconnect lines 100, the n-type active regions 101, and the p-type active regions 102.

According to the cell based design, complex circuits such as a CPU, memory, A-D converter or micro cell are prepared in advance for forming a standard and basic element aggregate. These elements are selected and combined according to the function required by the user, to realize a desired LSI. FIG. 17 is a plan view illustrating cell based design. In FIG. 17, gate patterns of gate interconnect lines 104 provided on active regions are shown to be nonuniform. As a result, space in one chip can be used more effectively than the gate array. An n-type impurity diffusion region, the gate interconnect line 104, and another n-type impurity diffusion region adjacent to this gate interconnect line 104 form a transistor. These n-type impurity diffusion regions adjacent to each other through the gate interconnect line 104 are referred to as n-type active regions 105. A plurality of p-type impurity diffusion regions arranged in the same manner as the plurality of n-type active regions 105 are referred to as p-type active regions 106. The gate interconnect line 104, the n-type active region 105, and the p-type active region 106 are provided with contact holes 107 for interconnecting a plurality of transistors including the gate interconnect lines 104, the n-type active regions 105, and the p-type active regions 106.

According to the foregoing cell based design, the gate interconnect lines 104 provided on the n-type active regions 105 or on the p-type active regions 106 may have nonuniformity in gate pattern (gate structure). In this case, complicated processing using CAD system is required in forming a mask, so that the gate interconnect lines 104 are uniform in finished gate pattern (gate structure). However, such complicated processing using CAD system causes the problem that huge amount of time and costs are required.

In order for the gate interconnect lines provided on the active regions to have uniform gate pattern (gate structure) while avoiding this problem, gate patterns (structures) thereof may be defined to be uniform in design stage. According to the cell based design in the background art shown in FIG. 17, however, uniformity of the gate patterns (gate structures) are not allowed according to whether the contact holes on the active regions are required or not. In order to realize uniform gate pattern (gate structure), the p-type active regions 106 can be defined to extend more widely as shown in FIG. 18, which in turn results in increase in area of the p-type active regions 106 and eventually, increase in area to be assigned exclusively to the basic element aggregate.

SUMMARY OF THE INVENTION

It is therefore an object of the present invention to provide a semiconductor integrated circuit having a basic element aggregate that realizes uniformity in finished gate pattern (gate structure) after wafer processing requiring no complicated processing using CAD system, while causing no increase in area to be assigned exclusively to the basic element aggregate.

According to the present invention, the semiconductor integrated circuit has a cell-based basic element aggregate. The cell-based basic element aggregate includes a first active region and a second active region provided on a semiconductor substrate, and a plurality of gate interconnect lines. The plurality of gate interconnect lines extend on the first and second active regions in a predetermined direction. The plurality of gate interconnect lines are equally spaced at least on the first and second active regions. At least one of the first and second active regions is provided with at least one protruding part extending in the predetermined direction. The cell-based basic element aggregate further includes a contact hole provided to the at least one protruding part.

At least one protruding part is provided to at least one of the first and second active regions. Therefore, uniformity of the gate interconnect lines in finished gate pattern (gate structure) is allowed on the first and second active regions after wafer processing requiring no complicated processing using CAD system. Further, there occurs no increase in area to be assigned exclusively to the basic element aggregate.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
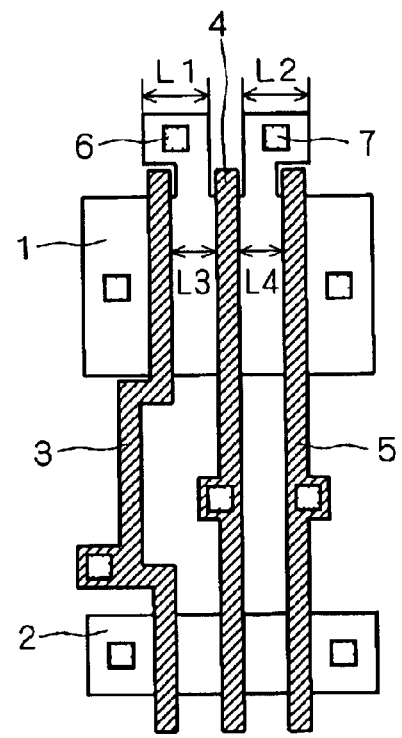
FIG. 1 is a plan view illustrating a basic element aggregate of a semiconductor integrated circuit according to a first preferred embodiment of the present invention.

FIG. 1 is a plan view illustrating the basic element aggregate of a semiconductor integrated circuit according to the first preferred embodiment of the present invention. More particularly, FIG. 1 illustrates a part of the basic element aggregate including p-channel transistors and n-channel transistors. In FIG. 1, A p-type impurity diffusion region, a gate interconnect line, and another p-type impurity diffusion region adjacent to this gate interconnect line form the p-channel transistor. These p-type impurity diffusion regions adjacent to each other through the gate interconnect line are referred to as p-type active regions 1 (alternatively, as first or second active regions 1). Similarly, an n-type impurity diffusion region, a gate interconnect line, and another n-type impurity diffusion region adjacent to this gate interconnect line form an n-channel transistor. These n-type impurity diffusion regions are referred to as n-type active regions 2 (alternatively, as second or first active regions 2). Three gate interconnect lines 3, 4 and 5 are provided on the p-type active regions 1 and on the n-type active regions 2.

The p-type active regions 1 have protruding parts for holding therein contact holes 6 and 7. These protruding parts are each arranged on the side opposite to that facing the n-type active regions 2. The contact hole 6 in one protruding part is provided between the gate interconnect lines 3 and 4. The contact hole 7 in the other protruding part is provided between the gate interconnect lines 4 and 5. The contact holes 6 and 7 are used for interconnecting a plurality of transistors to be defined in the p-type active regions 1.

According to such basic element aggregate, the contact holes 6 and 7 do not exist between the gate interconnect lines 3, 4 and 5 defined on the p-type active regions 1 except for the protruding parts thereof. Without limited by the positions of the contact holes 6 and 7, it is thus allowed to arrange the gate interconnect lines 3, 4 and 6 on the p-type active regions 1 excluding the protruding parts thereof. As a result, the gate patterns (gate structures) of the gate interconnect lines 3, 4 and 5 can be uniform on the p-type active regions 1 except for the protruding parts thereof. Further, the gate interconnect lines 3, 4 and 5 are so formed to bypass the protruding parts.

Even when the basic element aggregate follows cell based design, the configuration illustrated in FIG. 1 allows the gate interconnect lines 3, 4 and 5 to be uniform in finished gate pattern (gate structure) on the p-type active regions 1 after wafer processing requiring no complicated processing using CAD system. Further, the configuration in FIG. 1 requires no increase in area of the p-type active regions 1. As a result, according to the first preferred embodiment, there occurs no increase in area to be assigned exclusively to the basic element aggregate.

In FIG. 1, a width L1 of the protruding part for holding therein the contact hole 6 is larger than a space L3 between the gate interconnect lines 3 and 4 on the p-type active regions 1 (namely, the space extending in a direction parallel to that of the width L1). Similarly, a width L2 of the protruding part for holding therein the contact hole 7 is larger than a space L4 between the gate interconnect lines 4 and 5 on the p-type active regions 1. As a result, the widths L1 and L2 of the protruding parts can be determined without limited by the spaces L3 and L4, thereby improving flexibility in designing the shape of the contact hole. The foregoing relation in dimension is further applicable to the protruding part in the modifications of the first preferred embodiment and other preferred embodiments to be described later. In the figures to be referred to later, the width of the protruding part and the space between the gate interconnect lines are not specifically indicated.

Figure 2:
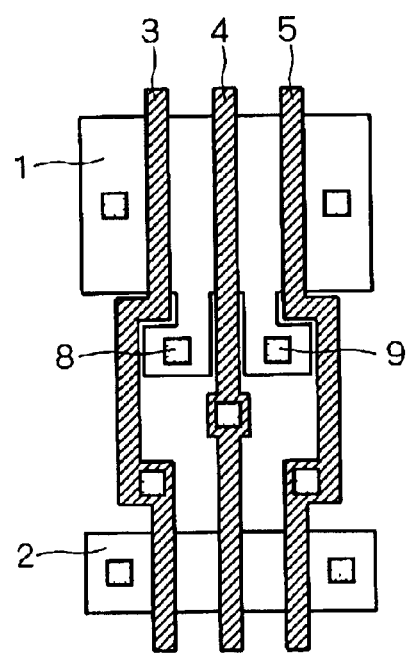
FIGS. 2 and 3 are plan views each illustrating a basic element aggregate of a semiconductor integrated circuit according to a modification of the first preferred embodiment of the present invention.
Figure 3:
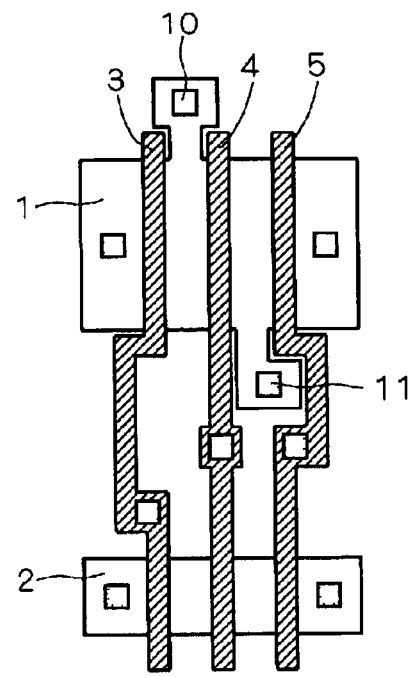

FIGS. 2 and 3 are plan views each illustrating the basic element aggregate of a semiconductor integrated circuit according to the modification of the first preferred embodiment. In the basic element aggregate in FIG. 2, the p-type active regions 1 have protruding parts for holding therein contact holes 8 and 9. These protruding parts are each arranged on the side facing the n-type active regions 2 (in FIG. 2, on the lower part of the p-type active region 1). The contact hole 8 in one protruding part is provided between the gate interconnect lines 3 and 4. The contact hole 9 in the other protruding part is provided between the gate interconnect lines 4 and 5. According to the basic element aggregate shown in FIG. 2, the same effects as obtained in the aggregate shown in FIG. 1 are also realized.

In the basic element aggregate in FIG. 3, the p-type active regions 1 have protruding parts for holding therein contact holes 10 and 11. The protruding part to include therein the contact hole 10 is arranged on the side opposite to that facing the n-type active regions 2, and the protruding part to include therein the contact hole 11 is arranged on the side facing the n-type active regions 2. The arrangement of the protruding parts for holding therein the contact holes 10 and 11 is not limited to the one given in FIG. 3. As long as one protruding part is provided with the p-type active region 1 on the side facing the n-type active regions 2 and other part is on the side opposite thereto, any arrangement may be applicable. The contact hole 10 in one protruding part is provided between the gate interconnect lines 3 and 4. The contact hole 11 in the other protruding part is provided between the gate interconnect lines 4 and 5.

According to the basic element aggregate shown in FIG. 3, the same effects as obtained in the aggregate shown in FIG. 1 are also realized. Further, the basic element aggregate in FIG. 3 improves flexibility in arrangement of the contact holes. As a result, flexibility in arrangement of interconnect lines to be connected to these contact holes can be also enhanced.

Second Preferred Embodiment

Figure 4:
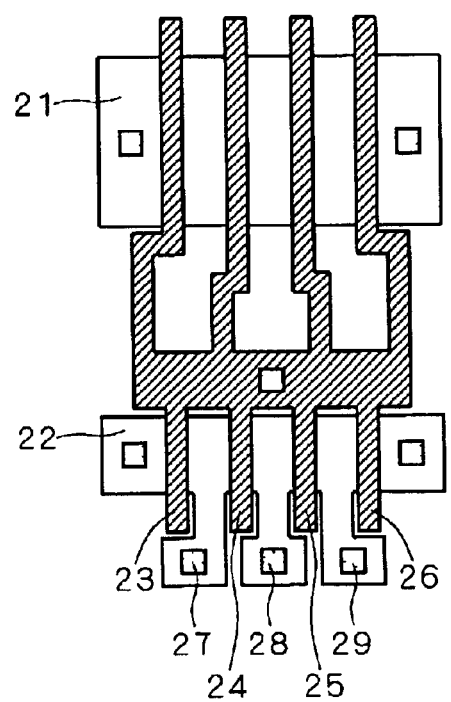
FIG. 4 is a plan view illustrating a basic element aggregate of a semiconductor integrated circuit according to a second preferred embodiment of the present invention.

According to the second preferred embodiment of the present invention, the configuration of the contact hole provided in the p-type active region in the first preferred embodiment is applied to the n-type active region. FIG. 4 is a plan view illustrating the basic element aggregate of a semiconductor integrated circuit according to the second preferred embodiment. P-type active regions 21 and n-type active regions 22 are provided on a semiconductor substrate (not shown). A p-type impurity diffusion region, a gate interconnect line, and another p-type impurity diffusion region adjacent to this gate interconnect line form a transistor. These p-type impurity diffusion regions adjacent to each other through the gate interconnect line are referred to as the p-type active regions 21 (alternatively, as first or second active regions 21). Similarly, a plurality of n-type impurity diffusion regions are referred to as the n-type active regions 22 (alternatively, second or first active regions 22). Four gate interconnect lines 23, 24, 25 and 26 are provided on the p-type active regions 21 and on the n-type active regions 22.

The n-type active regions 22 have protruding parts for holding therein contact holes 27, 28 and 29. These protruding parts are each arranged on the side opposite to that facing the p-type active regions 21 (in FIG. 4, on the lower part of the n-type active region 22). The contact hole 27 in one protruding part is provided between the gate interconnect lines 23 and 24. The contact hole 28 in another protruding part is provided between the gate interconnect lines 24 and 25. Further, the contact hole 29 in another protruding part is provided between the gate interconnect lines 25 and 26. The contact holes 27, 28 and 29 are used for interconnecting a plurality of transistors to be defined in the n-type active regions 22.

According to such basic element aggregate, the contact holes 27, 28 and 29 do not exist between the gate interconnect lines 23, 24, 25 and 26 defined on the n-type active regions 22 except for the protruding parts thereof. Without limited by the positions of the contact holes 27, 28 and 29, it is thus allowed to arrange the gate interconnect lines 23, 24, 25 and 26 on the n-type active regions 22 excluding the protruding parts thereof. As a result, the gate patterns (gate structures) of the gate interconnect lines 23, 24, 25 and 26 can be uniform on the n-type active regions 22 except for the protruding parts thereof. Further, the gate interconnect lines 23, 24, 25 and 26 are so formed to bypass the protruding parts.

Even when the basic element aggregate follows cell based design, the configuration illustrated in FIG. 4 allows the gate interconnect lines 23, 24, 25 and 26 to be uniform in finished gate pattern (gate structure) on the n-type active regions 22 after wafer processing requiring no complicated processing using CAD system. Further, the configuration in FIG. 4 requires no increase in area of the n-type active regions 22. As a result, according to the second preferred embodiment, there occurs no increase in area to be assigned exclusively to the basic element aggregate.

Figure 5:
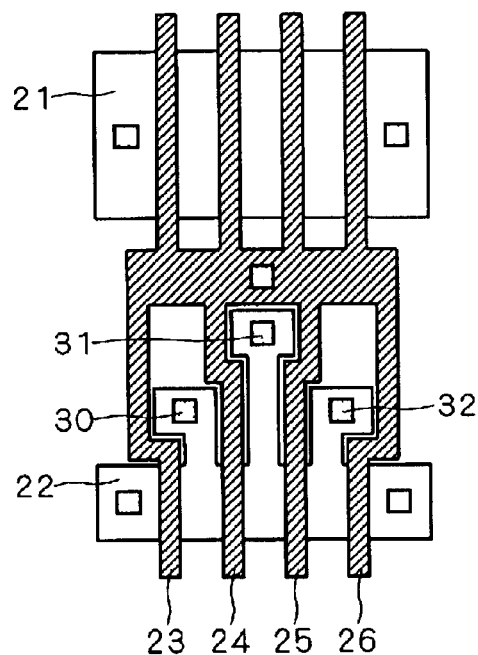
FIGS. 5 and 6 are plan views each illustrating a basic element aggregate of a semiconductor integrated circuit according to a modification of the second preferred embodiment of the present invention.
Figure 6:
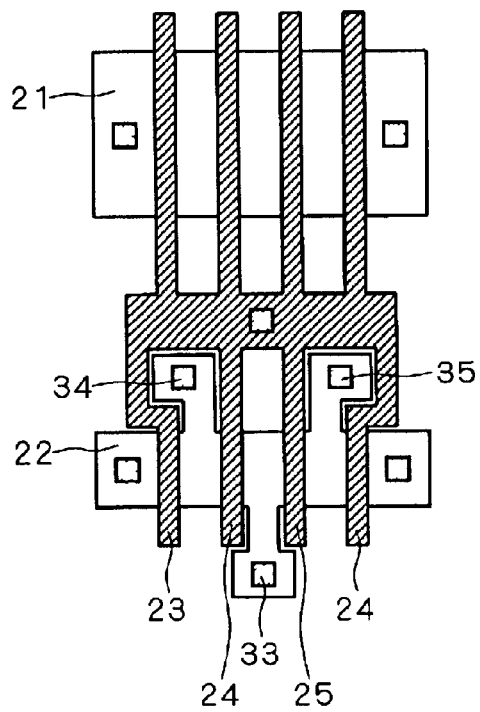

FIGS. 5 and 6 are plan views each illustrating the basic element aggregate of a semiconductor integrated according to the modification of the second preferred embodiment. In the basic element aggregate in FIG. 5, the n-type active regions 22 have protruding parts for holding therein contact holes 30, 31 and 32. These protruding parts are each arranged on the side facing the p-type active regions 21 (in FIG. 5, on the upper part of the n-type active region 22). According to the basic element aggregate shown in FIG. 5, the same effects as obtained in the aggregate shown in FIG. 4 are also realized.

In the basic element aggregate shown in FIG. 6, the n-type active regions 22 have protruding parts for holding therein contact holes 33, 34 and 35. The protruding part to include therein the contact hole 33 is arranged on the side opposite to that facing the p-type active regions 21, and the protruding parts to include therein the contact holes 34 and 35 are each arranged on the side facing the p-type active regions 21. The arrangement of the protruding parts for holding therein the contact holes 33, 34 and 35 is not limited to the one given in FIG. 6. As long as one protruding part is provided with the n-type active region 22 on the side facing the p-type active regions 21 and other part is on the side opposite thereto, any arrangement may be applicable.

According to the basic element aggregate shown in FIG. 6, the same effects as obtained in the aggregate shown in FIG. 4 are also realized. Further, the basic element aggregate in FIG. 6 improves flexibility in arrangement of the contact holes. As a result, flexibility in arrangement of interconnect lines to be connected to these contact holes can be also enhanced.

Third Preferred Embodiment

Figure 7:
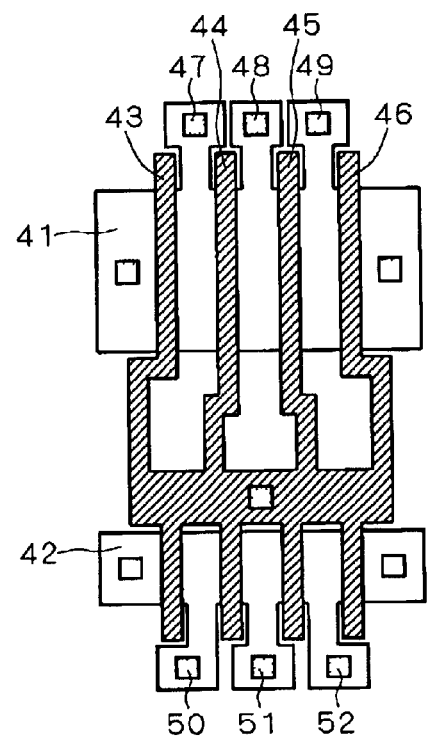
FIG. 7 is a plan view illustrating a basic element aggregate of a semiconductor integrated circuit according to a third preferred embodiment of the present invention.
Figure 8:
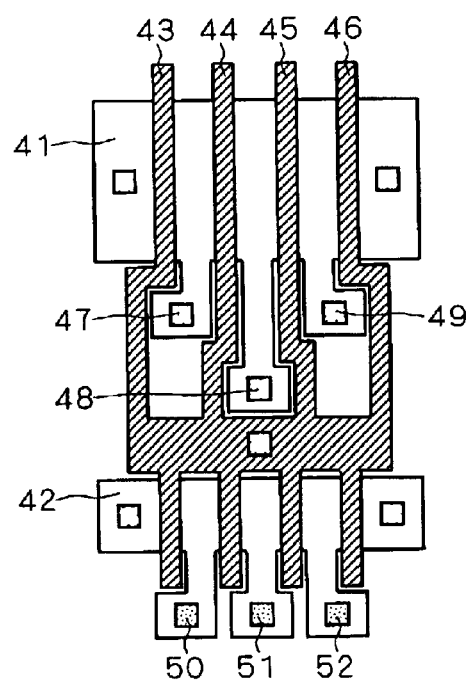
FIGS. 8 through 15 are plan views each illustrating a basic element aggregate of a semiconductor integrated circuit according to a modification of the third preferred embodiment of the present invention.

According to the third preferred embodiment of the present invention, the configuration of the basic element aggregate of the first preferred embodiment and that of the basic element aggregate of the second preferred embodiment are combined. FIG. 7 is a plan view illustrating the basic element aggregate of a semiconductor integrated circuit according to the third preferred embodiment. P-type active regions 41 and n-type active regions 42 are provided on a semiconductor substrate (not shown). A p-type impurity diffusion region, a gate interconnect line, and another p-type impurity diffusion region adjacent to this gate interconnect line form a transistor. These p-type impurity diffusion regions adjacent to each other through the gate interconnect line are referred to as the p-type active regions 41 (alternatively, as first or second active regions 41). Similarly, a plurality of n-type impurity diffusion regions are referred to as the n-type active regions 42 (alternatively, second or first active regions 42). Four gate interconnect lines 43, 44, 45 and 46 are provided on the p-type active regions 41 and on the n-type active regions 42.

The p-type active regions 41 have protruding parts for holding therein contact holes 47, 48 and 49. These protruding parts are each arranged on the side opposite to that facing the n-type active regions 42 (in FIG. 7, on the upper part of the p-type active region 41). The contact hole 47 in one protruding part is provided between the gate interconnect lines 43 and 44. The contact hole 48 in another protruding part is provided between the gate interconnect lines 44 and 45. Further, the contact hole 49 in another protruding part is provided between the gate interconnect lines 45 and 46. The contact holes 47, 48 and 49 are used for interconnecting a plurality of transistors to be defined in the p-type active regions 41.

The n-type active regions 42 have protruding parts for holding therein contact holes 50, 51 and 52. These protruding parts are each arranged on the side opposite to that facing the p-type active regions 41 (in FIG. 7, on the lower part of the n-type active region 42). The contact hole 50 in one protruding part is provided between the gate interconnect lines 43 and 44. The contact hole 51 in another protruding part is provided between the gate interconnect lines 44 and 45. Further, the contact hole 52 in another protruding part is provided between the gate interconnect lines 45 and 46. The contact holes 50, 51 and 52 are used for interconnecting a plurality of transistors to be defined in the n-type active regions 42.

According to such basic element aggregate, the contact holes 47, 48, 49, 50, 51 and 52 do not exist between the gate interconnect lines 43, 44, 45 and 46 defined on the p-type active regions 41 and on the n-type active regions 42 except for their respective protruding parts. Without limited by the positions of the contact holes 47, 48, 49, 50, 51 and 52, it is thus allowed to arrange the gate interconnect lines 43, 44, 45 and 46 on the p-type active regions 41 and on the n-type active regions 42 excluding their respective protruding parts. As a result, the gate patterns (gate structures) of the gate interconnect lines 43, 44, 45 and 46 can be uniform on the p-type active regions 41 and on the n-type active regions 42 except for their respective protruding parts. Further, the gate interconnect lines 43, 44, 45 and 46 are so formed to bypass the protruding parts.

Even when the basic element aggregate follows cell based design, the configuration illustrated in FIG. 7 allows the gate interconnect lines 43, 44, 45 and 46 to be uniform in finished gate pattern (gate structure) on the p-type active regions 41 and on the n-type active regions 42 after wafer processing requiring no complicated processing using CAD system. Further, the configuration in FIG. 7 requires no increase in area of the p-type active regions 41 and of the n-type active regions 42. As a result, according to the third preferred embodiment, there occurs no increase in area to be assigned exclusively to the basic element aggregate.

FIGS. 8 through 15 are plan views each illustrating the basic element aggregate of a semiconductor integrated circuit according to the modification of the third preferred embodiment. The applicability of the third preferred embodiment is not limited to the basic element aggregate shown in FIG. 7. The configurations in FIGS. 8 through 15 can be considered as the modifications thereof. The basic element aggregates shown in FIGS. 8 and 9 have common characteristic that the protruding parts for holding therein the contact holes 50, 51 and 52 are each provided on the lower part of the n-type active region 42, which is the same as in the basic element aggregate shown in FIG. 7. However, the basic element aggregate in FIG. 8 differs from the aggregate in FIG. 9 in that the protruding parts for holding therein the contact holes 47, 48 and 49 are each provided on the lower part of the p-type active region 41. Further, the basic element aggregate in FIG. 9 differs from the aggregate in FIG. 8 in that the protruding parts for holding therein the contact holes 47 and 49 are each provided on the upper part of the p-type active region 41, and the protruding part for holding therein the contact hole 48 is provided on the lower part thereof.

Figure 10:
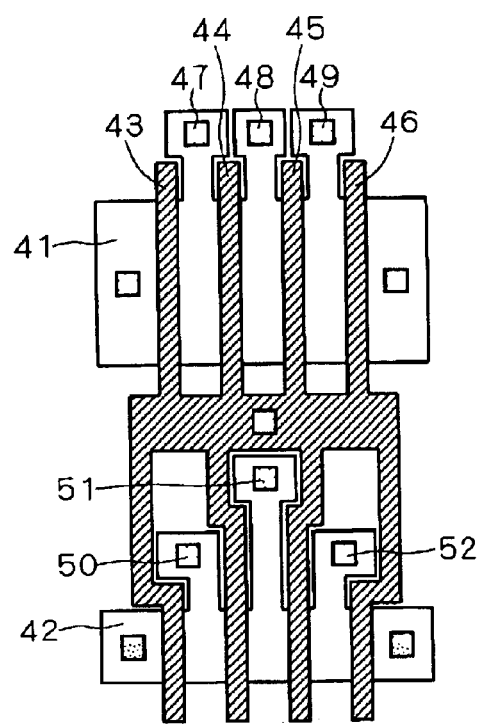
Figure 11:
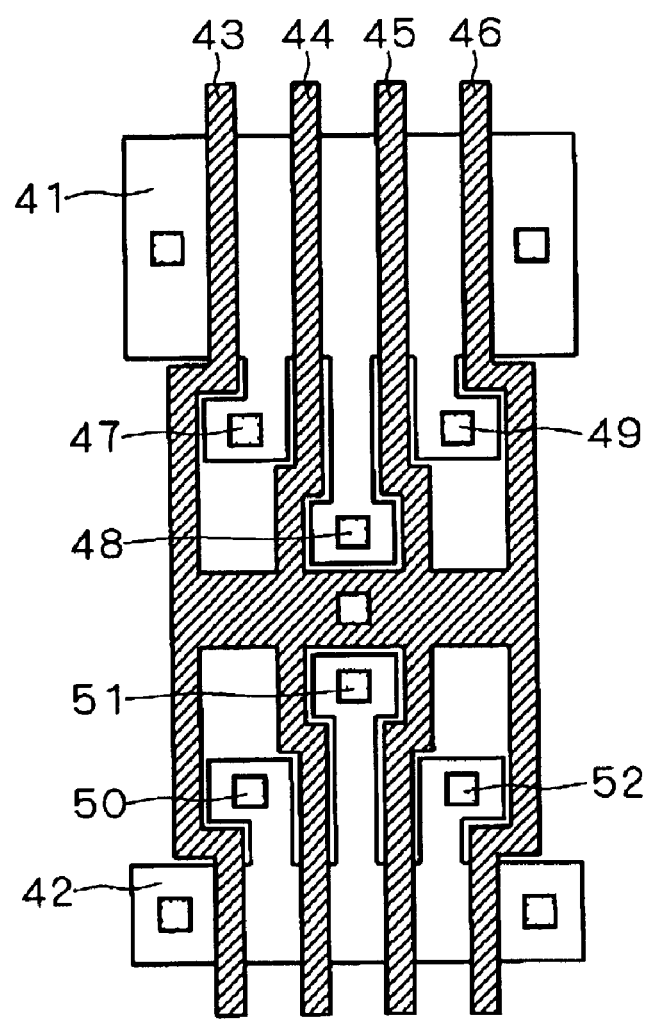
Figure 12:
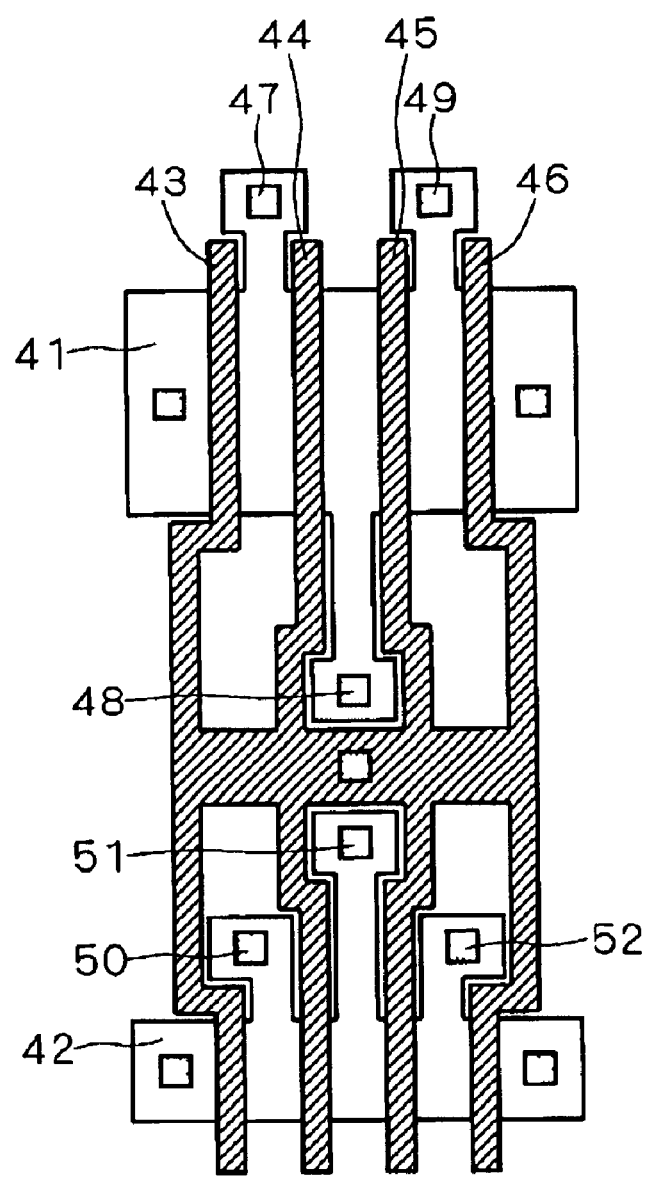

The basic element aggregates shown in FIGS. 10, 11 and 12 have common characteristic that the protruding parts for holding therein the contact holes 50, 51 and 52 are each provided on the upper part of the n-type active region 42. However, the basic element aggregate in FIG. 10 differs from the aggregates in FIGS. 11 and 12 in that the protruding parts for holding therein the contact holes 47, 48 and 49 are each provided on the upper part of the p-type active region 41. Further, the basic element aggregate in FIG. 11 differs from the aggregates in FIGS. 10 and 12 in that the protruding parts for holding therein the contact holes 47, 48 and 49 are each provided on the lower part of the p-type active region 41. Still further, the basic element aggregate in FIG. 12 differs from the aggregates in FIGS. 10 and 11 in that the protruding parts for holding therein the contact holes 47 and 49 are each provided on the upper part of the p-type active region 41, and the protruding part for holding therein the contact hole 48 is provided on the lower part thereof.

Figure 13:
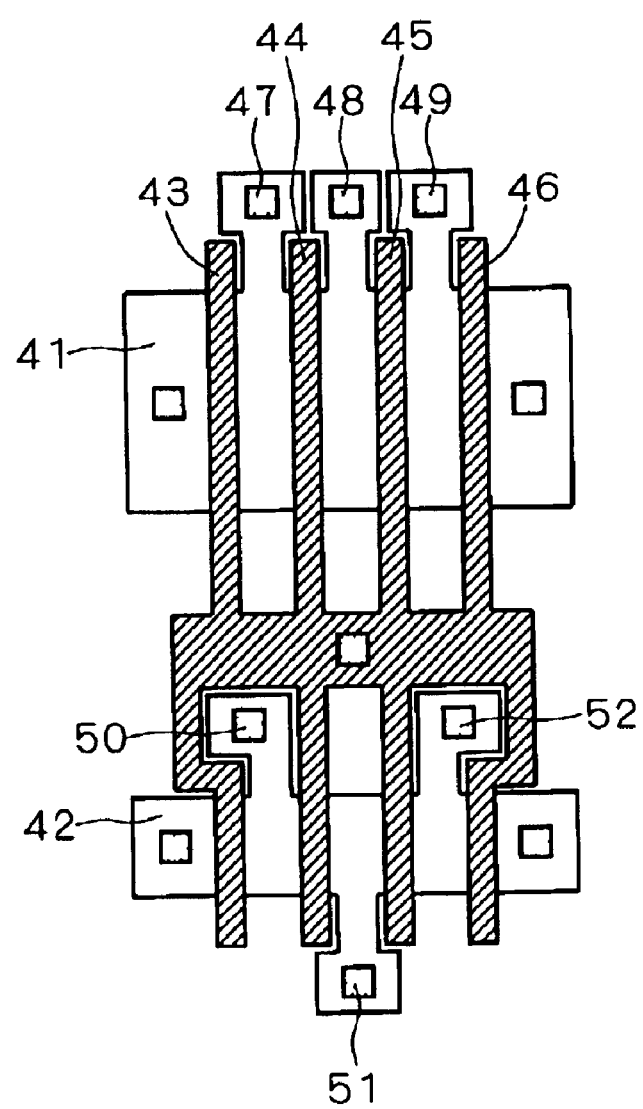
Figure 14:
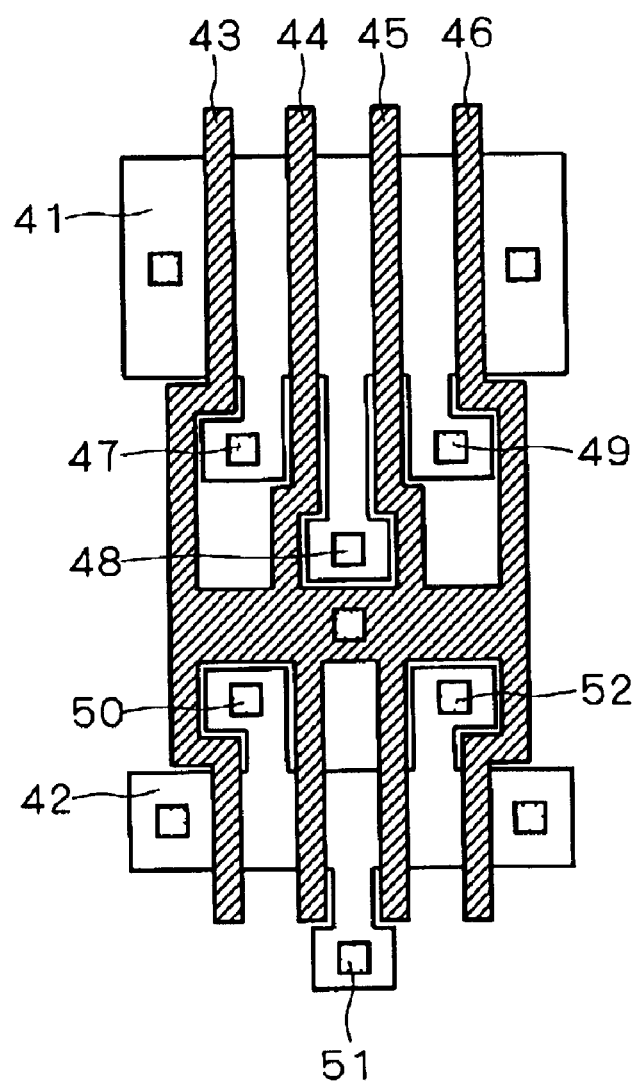
Figure 15:
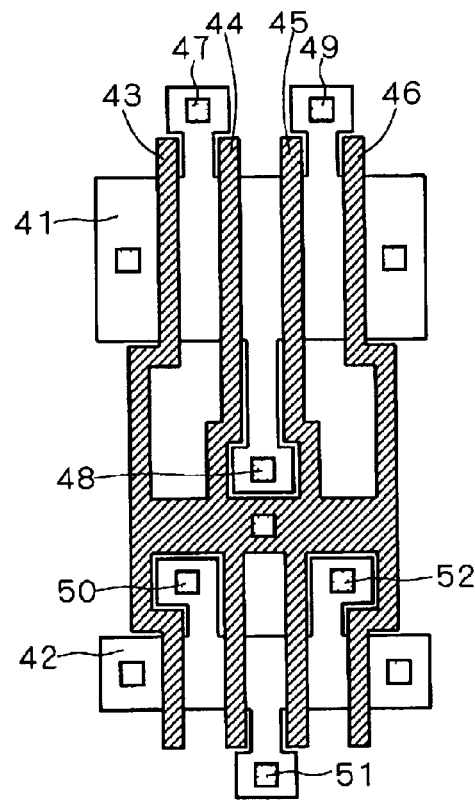
Figure 16:
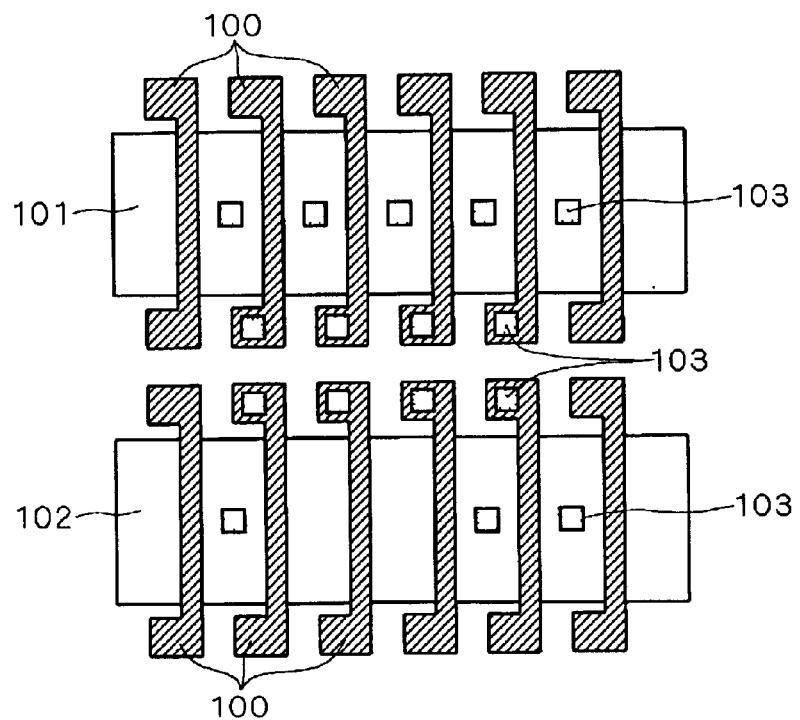
FIG. 16 is a plan view illustrating the background-art basic element aggregate of the semiconductor integrated circuit following gate array technology.
Figure 17:
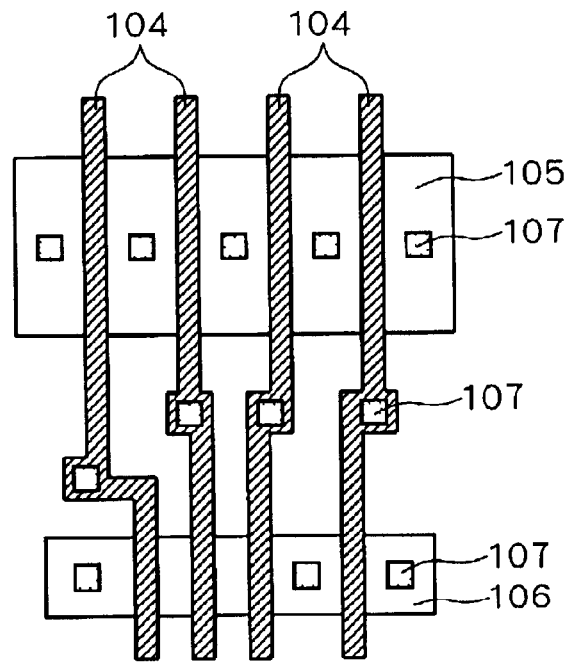
FIGS. 17 and 18 are plan views each illustrating the background-art basic element aggregate of the semiconductor integrated circuit following cell based design.
Figure 18:
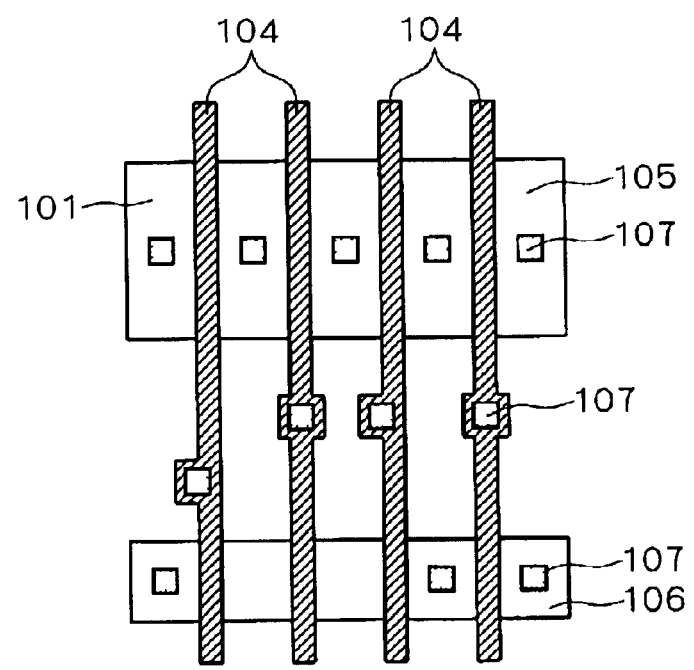

The basic element aggregates shown in FIGS. 13, 14 and 15 have common characteristic that the protruding parts for holding therein the contact holes 50 and 52 are each provided on the upper part of the n-type active region 42, and the protruding part for holding therein the contact hole 51 is provided on the lower part thereof. However, the basic element aggregate in FIG. 13 differs from the aggregates in FIGS. 14 and 15 in that the protruding parts for holding therein the contact holes 47, 48 and 49 are each provided on the upper part of the p-type active region 41. Further, the basic element aggregate in FIG. 14 differs from the aggregates in FIGS. 13 and 15 in that the protruding parts for holding therein the contact holes 47, 48 and 49 are each provided on the lower part of the p-type active region 41. Still further, the basic element aggregate in FIG. 15 differs from the aggregates in FIGS. 13 and 14 in that the protruding parts for holding therein the contact holes 47 and 49 are each provided on the upper part of the p-type active region 41, and the protruding part for holding therein the contact hole 48 is provided on the lower part thereof.

Figure 9:
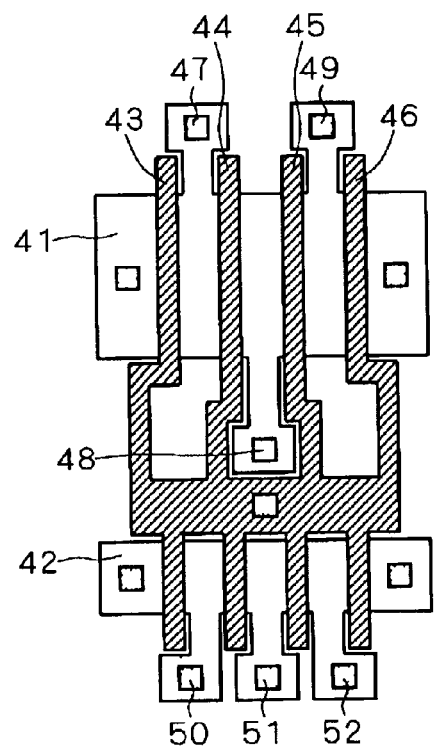

The arrangement of the protruding parts for holding therein the contact holes 47, 48 and 49 is not limited to those of the basic element aggregates in FIGS. 9, 12 and 15. As long as the upper and lower parts of the p-type active region 41 are respectively provided with the protruding parts, any arrangement may be applicable. Further, the arrangement of the protruding parts for holding therein the contact holes 50, 51 and 52 is not limited to those of the basic element aggregates in FIGS. 13, 14 and 15. As long as the upper and lower parts of the n-type active region 42 are respectively provided with the protruding parts, any arrangement may be applicable.

According to the basic element aggregate shown in each one of FIGS. 8 through 15, the same effects as obtained in the aggregate shown in FIG. 7 are also realized. Further, the basic element aggregate shown in each one of FIGS. 9, and 12 through 15 improves flexibility in arrangement of the contact holes. As a result, flexibility in arrangement of interconnect lines to be connected to these contact holes can be also enhanced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit having a cell-based basic element aggregate, comprising:
   a first active region and a second active region provided on a semiconductor substrate; and
   a plurality of gate interconnect lines extending on said first and second active regions in a first predetermined direction, said plurality of gate interconnect lines being equally spaced at least on said first and second active regions, wherein
      at least one of said first and second active regions is provided with at least one protruding part extending in said first predetermined direction,
      said cell-based basic element aggregate further comprising a contact hole provided on said at least one protruding part, and
      said at least one protruding part having a width along a second predetermined direction larger than a width along the second predetermined direction of a space defined between two adjacent gate interconnect lines of said plurality of sate interconnect lines on said first and second active regions.

2. The semiconductor integrated circuit according to claim 1, wherein
   said at least one protruding part is provided on one of said first and second active regions, and
   said at least one protruding part of said one of said first and second active regions is arranged on a side opposite to a side facing the other one of said first and second active regions.

3. The semiconductor integrated circuit according to claim 1, wherein said at least one protruding part is provided on one of said first and second active regions, and said at least one protruding part of said one of said first and second active regions is arranged on a side facing the other one of said first and second active regions.

4. The semiconductor integrated circuit according to claim 1, wherein said at least one protruding part includes a plurality of protruding parts provided on one of said first and second active regions, one of said plurality of protruding parts of said one of said first and second active regions is arranged on a side facing the other one of said first and second active regions, and another one of said plurality of protruding parts of said one of said first and second active regions is arranged on a side opposite to said side facing said other one of said first and second active regions.

5. The semiconductor integrated circuit according to claim 2, wherein said at least one protruding part is further provided on the other one of said first and second active regions, and said at least one protruding part of said other one of said first and second active regions is arranged on a side opposite to a side facing said one of said first and second active regions.

6. The semiconductor integrated circuit according to claim 2, wherein said at least one protruding part is further provided on the other one of said first and second active regions, and said at least one protruding part of said other one of said first and second active regions is arranged on a side facing said one of said first and second active regions.

7. The semiconductor integrated circuit according to claim 2, wherein said at least one protruding part includes a plurality of protruding parts further provided on the other one of said first and second active regions, one of said plurality of protruding parts of said other one of said first and second active regions is arranged on a side facing said one of said first and second active regions, and another one of said plurality of protruding parts of said other one of said first and second active regions is arranged on a side opposite to said side facing said one of said first and second active regions.

8. The semiconductor integrated circuit according to claim 5, wherein said at least one protruding part is further provided on the other one of said first and second active regions, and said at least one protruding part of said other one of said first and second active regions is arranged on a side opposite to a side facing said one of said first and second active regions.

9. The semiconductor integrated circuit according to claim 5, wherein said at least one protruding part is further provided on the other one of said first and second active regions, and said at least one protruding part of said other one of said first and second active regions is arranged on a side facing said one of said first and second active regions.

10. The semiconductor integrated circuit according to claim 5, wherein said at least one protruding part includes a plurality of protruding parts further provided on the other one of said first and second active regions, one of said plurality of protruding parts of said other one of said first and second active regions is arranged on a side facing said one of said first and second active regions, and another one of said plurality of protruding parts of said other one of said first and second active regions is arranged on a side opposite to said side facing said one of said first and second active regions.

11. The semiconductor integrated circuit according to claim 4, wherein said at least one protruding part is further provided on the other one of said first and second active regions, and said at least one protruding part of said other one of said first and second active regions is arranged on a side opposite to a side facing said one of said first and second active regions.

12. The semiconductor integrated circuit according to claim 4, wherein said at least one protruding part is further provided on the other one of said first and second active regions, and said at least one protruding part of said other one of said first and second active regions is arranged on a side facing said one of said first and second active regions.

13. The semiconductor integrated circuit according to claim 4, wherein said at least one protruding part includes a plurality of protruding parts further provided on the other one of said first and second active regions, one of said plurality of protruding parts of said other one of said first and second active regions is arranged on a side facing said one of said first and second active regions, and another one of said plurality of protruding parts of said other one of said first and second active regions is arranged on a side opposite to said side facing said one of said first and second active regions.

14. The semiconductor integrated circuit according to claim 1, wherein said plurality of gate interconnect lines are so placed to bypass said at least one protruding part.

* * * * *